US006978067B2

(12) United States Patent
Herbert et al.

(10) Patent No.: US 6,978,067 B2
(45) Date of Patent: Dec. 20, 2005

(54) HORIZONTAL ACCESS SEMICONDUCTOR PHOTO DETECTOR

(75) Inventors: David C W Herbert, Worcs (GB); Edward T R Chidley, Worcs (GB); Roger T Carline, Worcs (GB); Weng Y Leong, Worcs (GB); David R Wight, Worcs (GB); David J Robbins, Worcs (GB); John M Heaton, Worcs (GB)

(73) Assignee: QinetiQ Limited, Farnborough (GB)

( * ) Notice: Subject to any disclaimer, the term of this patent is extended or adjusted under 35 U.S.C. 154(b) by 30 days.

(21) Appl. No.: 10/276,993

(22) PCT Filed: May 18, 2001

(86) PCT No.: PCT/GB01/02211

§ 371 (c)(1),
(2), (4) Date: Jul. 14, 2003

(87) PCT Pub. No.: WO01/90802

PCT Pub. Date: Nov. 29, 2001

(65) Prior Publication Data

US 2004/0013367 A1    Jan. 22, 2004

(30) Foreign Application Priority Data

May 20, 2000 (GB) .................................... 0012167

(51) Int. Cl.[7] .......................... G02B 6/42; H01L 31/107
(52) U.S. Cl. .......................... 385/39; 385/131; 257/186
(58) Field of Search ............................. 385/27, 32, 31, 385/39; 257/186

(56) References Cited

U.S. PATENT DOCUMENTS

| | | | |
|---|---|---|---|
| 5,343,490 A | | 8/1994 | McCall |
| 5,790,583 A | * | 8/1998 | Ho .............................. 372/92 |
| 5,825,799 A | * | 10/1998 | Ho et al. ...................... 372/92 |
| 5,878,070 A | * | 3/1999 | Ho et al. ...................... 372/92 |
| 6,633,696 B1 | * | 10/2003 | Vahala et al. ................. 385/27 |

OTHER PUBLICATIONS

Hecht, Jeff, "Understanding Fiber Optics," 2002, Prentice-Hall, 4th ed., pp. 253-254, and 256.*
Han et al; "$In_xGa_{1-x}As$—$Al_yGa_{1-y}As$—GaAs Strained-Layer Quantum-Well Heterostructure Circular Ring Lasers"; IEEE, Photonics Technology Letters, IEEE Inc. New York, US; vol. 4, No. 8, Aug. 1, 1992, pp. 817-819, XP000292888.

* cited by examiner

Primary Examiner—John D. Lee
Assistant Examiner—James D. Stein
(74) Attorney, Agent, or Firm—Nixon & Vanderhye P.C.

(57) ABSTRACT

A horizontal access semiconductor photo detector (2) comprises a horizontal light absorbing layer (8) for converting light into photo-current which layer is configured to confine light within it in whispering gallery modes of propagation. The detector is configured to have a first waveguide portion (18) and a second light confining portion (20, 21) arranged such that the waveguide portion couples light into the detector and transfers light into the light confining portion so as to excite whispering gallery modes of propagation around the light confining portion. The light absorbing layer may be part of the light confining portion or alternatively light can be coupled into the light confining portion or alternatively light can be coupled into the light absorbing layer from the light confining portion by evanescent coupling. The excitation of whispering gallery modes within the light absorbing layer significantly increases the effective absorption coefficient of the light absorbing layer.

21 Claims, 14 Drawing Sheets

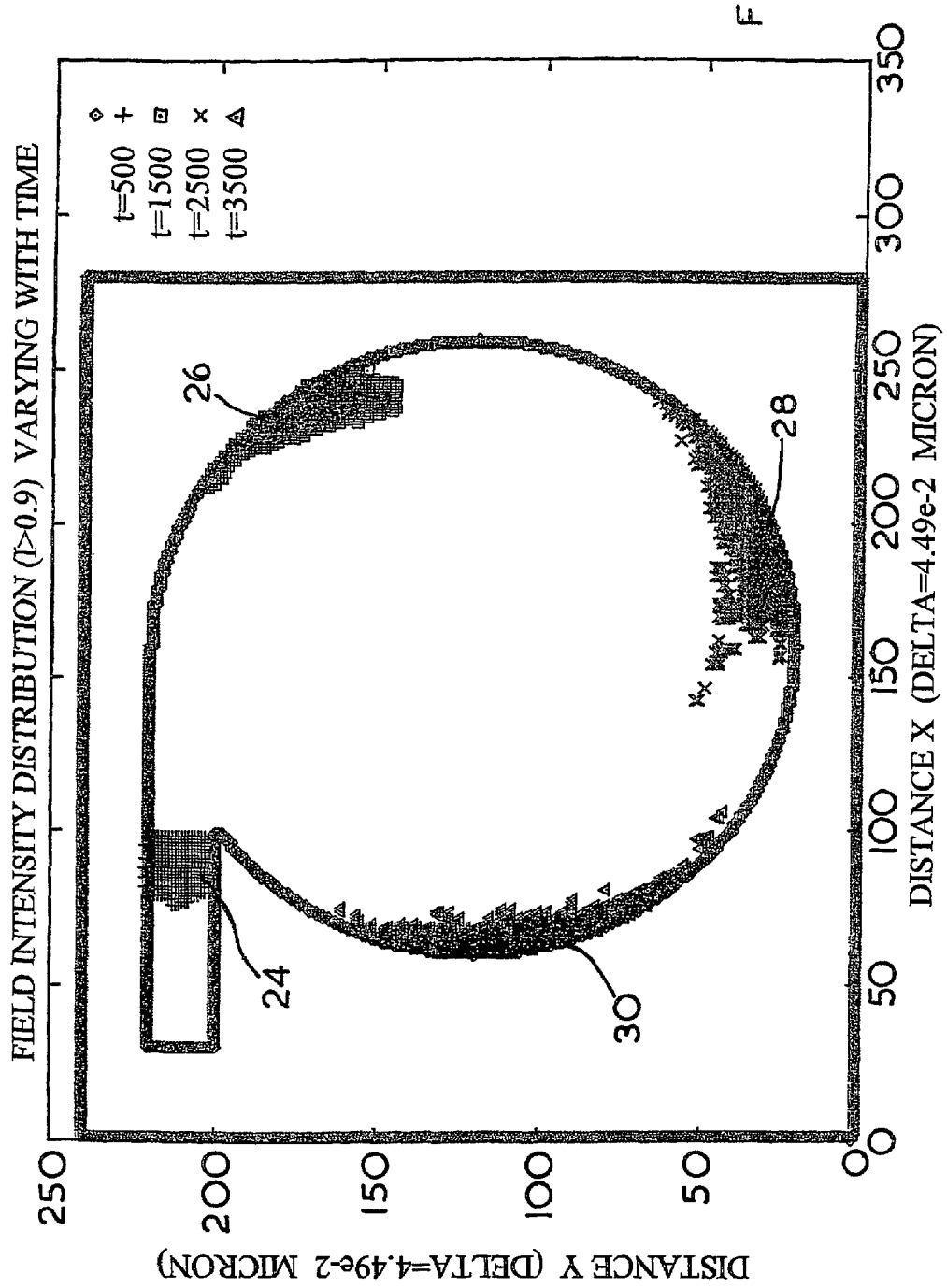

HORIZONTAL ACCESS SEMICONDUCTOR PHOTO DETECTOR

This application is the US national phase of international application PCT/GB01/02211 filed 18 May 2001, which designated the US.

The present invention relates to photo detectors, in particular to horizontal access photo detectors, such as metal-semiconductor-metal (m-s-m) detectors, p-i-n detectors and horizontal access separate absorption and multiplication (SAM) avalanche detectors.

Silicon (Si) avalanche photo-diodes (APD) offer very low noise avalanche gain when operated in analogue mode and so Si is the preferred material at the short wavelengths where Si is a good absorber. Si avalanche detectors operating in Geiger mode currently offer the best solution for very low level light detection at the short wavelengths for which Si is a good light absorber. Commercial Si single photon avalanche detectors (SPAD) can provide time resolutions of around 300 ps and laboratory devices have been reported with 30 ps time resolution at room temperature. An important factor in obtaining high speed performance in order to achieve such short time resolutions is thought to lie in the use of small structures, typically with a 1 $\mu$m thick light absorbing layer and a 5 $\mu$m cross sectional length.

The telecommunication industry is currently interested in avalanche photo diodes operating in analogue mode for conventional detection of weak signals and also in SPAD detectors for quantum cryptographyoperating at optical wavelengths of the order of 1.3 $\mu$m to 1.55 $\mu$m at which Si is a poor optical absorber. At these wavelengths the Indium Gallium Arsenide/indium Phosphide (InGaAs/InP) structures provide better light absorption. The drawback with detectors made with such materials is that the analogue APDs yield noisy avalanche gain and the SPAD detectors currently require cryogenic cooling to remove dark counts and provide a best speed performance of the order of 300 ps time resolution. The CdHgTe material system and the AlGaSb systems are also of interest for low noise avalanche detection at longer wavelengths, but will probably also require cooling for supresion of dark current.

For very high speed detectors it is necessary to reduce both the thickness of the absorption region to enable low transit times. Also, the cross-sectional area of the absorption region should be minimised in order to achieve small capacitances. This leaves a small volume of semi-conductor for absorbing light, which may imply low quantum efficiency. This is a particular problem as the wavelength of light to be detected approaches the absorption edge of a material because the absorption becomes weak.

To retain the superior electrical performance of Si based structures at wavelengths of the order of 1.3 $\mu$m and 1.55 $\mu$m, ie. beyond the absorption edge of Si, it is possible to use strained Silicon Germanium (SiGe) alloy narrow gap absorption layers (epi-layers) in detectors to absorb light. By using relatively high concentrations of Ge, the threshold for absorption of strained SiGe can be extended beyond 1.3 $\mu$m. In addition, in order to overcome the low light absorption at wavelengths of around 1.3 $\mu$m in SiGe, it is possible to use horizontal access waveguide geometries. By using horizontal access, relatively large lengths of SiGe can be passed by incident light (of the order of $10^3$ $\mu$m) while still allowing the thickness of the SiGe light absorbing layer in the direction of flow of the photo-current to remain small (of the order of 1 $\mu$m) in order to enable high speed operation of such detectors. However, the SiGe layer can be a significant source of leakage current and so the larger the volume of the SiGe layer the larger the leakage current. Also, for SPAD detectors a large horizontal cross-sectional area can lead to a spread in avalanche build up time with an associated contribution to jitter. Furthermore, small horizontal cross-sectional areas are preferred for such detectors in order to reduce capacitance and so reduce the RC constants associated with the detectors which can be important for active quenching of the avalanche-process in such detectors.

Photo-detectors based on semiconductor materials other than Si can suffer from the same problems as discussed above for Si when they are developed to operate close to their absorption edge.

The present invention provides a design of photo detector which can overcome the problems discussed above.

According to a first aspect of the present invention there is provided a horizontal access semiconductor photo detector comprising a horizontal light absorbing layer for converting light into photo-current which layer is configured to confine light within it in whispering gallery modes of propagation. By exciting low loss, total internal reflection whispering gallery modes of propagation the light incident on the detector is caused to propagate repeatedly through the volume of the light absorbing layer. In this way the effective absorption coefficient of the light absorbing layer is increased while using a light absorbing layer that is thin in the direction of flow of the photo-current and which has relatively small horizontal cross section. The devices according to the present invention can extend the photo-response to longer wavelengths or increase the effective absorption coefficient of materials which are intrinsically weak absorbers. Thus, a detector according to the present invention can be fast and have a low capacitance and yet still have high quantum efficiency because the effective absorption coefficient is high due to the incident light repeatedly passing around the light absorbing layer.

The optical confinement provided by using the present invention can be combined with other properties, and one particularly useful application is to extend the response of Si avalanche photodiodes to longer wavelengths. For example, it has been estimated that strained SiGe layers with up to 50% Ge can absorb at longer wavelengths than 1.55 $\mu$m. This suggests that by using an applied electric field together with high optical confinement using whispering gallery modes according to the present invention, it may be possible to achieve efficient detectors operating at the important 1.55 $\mu$m wavelength.

If the light absorbing layer has a higher refractive index than the material above and below it then the layer has a waveguiding effect and confines light within the vicinity of the absorbing layer in the vertical direction. SiGe has a higher refractive index than Si and fulfils this requirement. In general the light absorbing layer will have a lower bandgap and consequently would be expected to have a higher refractive index than the surrounding material. In some cases however there may be advantages in increasing the vertical confinement in the vicinity of the of the light absorbing layer by adding low refractive index cladding layers. For example, Aluminium Gallium Arsenide (AlGaAs) cladding layers are frequently used in GaAs based waveguide structures.

In a preferred configuration the photo detector is configured to have a waveguide portion and a light confining portion arranged such that the waveguide portion couples light into the detector and transfers light into the light confining portion so as to excite whispering gallery modes of propagation around the light confining portion. In this arrangement the waveguide portion transfers light into the light confining portion at an angle to a boundary of the light confining portion greater than the critical angle of the boundary. Thus, light transferred into the light confining portion undergoes repeated total internal reflections around the periphery of the boundary of the light confining portion so that the light propagates repeatedly around the light confining portion in whispering gallery modes. Preferably, the light confining portion has a cylindrical outer boundary and the waveguide portion injects light substantially tangentially into the light confining portion with respect to the cylindrical outer boundary. This latter is a good configuration in which to excite strong and long lasting whispering gallery modes of propagation.

For very small structures with diameters of a few wavelengths, there may be advantages in using light confining portions having a polygonal cross-section as opposed to a circular cross-section. Strongly curved surfaces of waveguides can induce radiation loss and replacing the curved sides of a cylindrical structure with the multiple plane sides of a polygonal structure may yield improved confinement.

In one preferred embodiment the detector comprises a longitudinal waveguide portion and a cylindrical light confining portion. This design can be improved upon by reducing the horizontal cross section of the detector by making the light confining structure ring shaped or annular. This is possible because the whispering gallery modes tend to propagate around the periphery of the light confining structure.

The waveguide portion may be tapered in order to reduce the size of the interface between the waveguide portion and the light confining portion. This can reduce the amount of scattering of the confined light away from the periphery of the light confining portion at the interface between the waveguide portion and the light confining portion. Techniques for designing such spot size converters are well established and 3D tapers are now possible which would ease the coupling of light into a detector according to the present invention.

According to one especially preferred embodiment, the horizontal light absorbing layer is a layer of the light confining portion. In this way light is coupled into the detector by the waveguide portion, which couples light into the light confining portion and thus into the light absorbing layer. The light thus coupled into the light confining layer propagates around the light confining layer in whispering gallery modes of propagation and is converted into photocurrent.

In an alternative preferred embodiment which does not exhibit this loss mechanism, a waveguide made of a material having a refractive index which is less than the refractive index of the light absorbing layer may be used in a detector according to the present invention in order to couple light into the light absorbing layer by evanescent coupling and to excite whispering gallery modes of propagation therein.

In a first embodiment using evanescent coupling, the horizontal light absorbing layer can be grown vertically above or below the light confining portion and has a higher refractive index than the light confining portion and light is therefore coupled vertically into the horizontal light absorbing layer from the light confining portion by evanescent coupling. In this embodiment the light confining layer and the light absorbing layer will have a common periphery, in that their peripheries have the same shape and are aligned above one another.

In a second preferred embodiment using evanescent coupling the waveguide portion and the light confining portion are made of a material having a refractive index which is less than the refractive index of the light absorbing layer and the light confining portion extends around the periphery of the light absorbing layer to incite whispering gallery modes in the light absorbing layer by evanescent coupling.

When utilising evanescent coupling the waveguide portion and the light confining portion of lower refractive index may be a polymer waveguide or a nitride waveguide, for example comprising $Si_3N_4$.

The photo detector discussed above may be a p-i-n detector. Alternatively, the photo detector with the above discussed features may be a separate absorption and multiplication avalanche detector. In this latter case the light absorbing layer can be located vertically above an avalanche layer. The avalanche layer may have the same cross-sectional shape as the light absorbing layer or alternatively the light absorbing layer may be formed as a mesa above the avalanche layer in order to inject photo-current into the centre of the avalanche region where the electric field is strongest. This will reduce jitter in the detector. If the avalanche zone has the same cross section as the light absorbing layer, then novel doping profiles can be employed to reduce the surface field in the avalanche region. More usually the side surfaces of the avalanche region will be shaped, for example, bevelled, to reduce surface field.

The detector may be silicon based and comprise a Silicon Germanium light absorbing layer which can absorb light at around 1.3 $\mu$m. Alternatively, the detector may be a Gallium Arsenide (GaAs) based detector which comprises an Indium Gallium Arsenide Nitride (InGaAsN) light absorbing layer which can absorb light at around 1.3 $\mu$m.

The present invention will now be described with reference to the following Figures in which:

FIGS. 3a to 3c show the results of a simulation of the photo detector of FIGS. 1 and 2 and comprise plots of the field intensity distribution of an incident light pulse at varying time steps of the simulation.

p-i-n and m-s-m (metal-semiconductor-metal) detectors are used in a large range of applications and the present invention, by increasing the effective absorption coefficient, allows operation to be extended closer to the absorption edge of the absorbing material used in such detectors. The idea also applies to novel detectors which use the Franz-Keldysh effect in which the optical absorption extends to longer wavelengths in high electric fields in a reverse biased diode. By simultaneously enhancing the effective absorption through optical confinement, the utility of this latter type of device could be greatly increased. Other possible applications include the new light confining structure combined with avalanche gain in avalanche photodiodes. The absorbing region and avalanche region can be combined when the structure is simply a p-i-n or m-s-m diode with structure in the 'i' region, reverse biased to produce avalanche multiplication, and shaped to increase optical confinement. Alternatively, the absorption region can be separated from the avalanche region in a separate absorption and multiplication (SAM) device.

Figure 1:
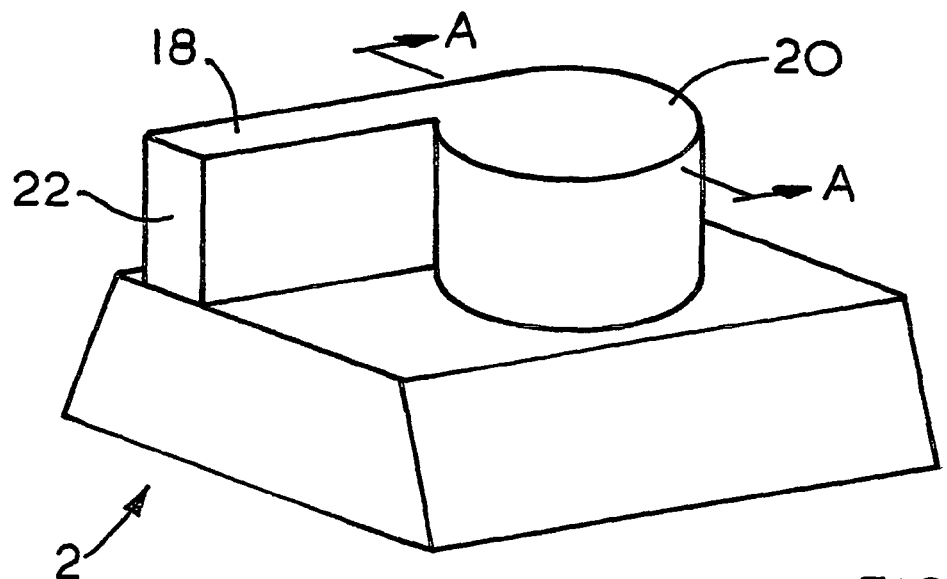
FIG. 1 shows schematically a perspective view of a photo detector comprising a photon bottle design having a cylindrical light confining portion according to the present invention.
Figure 2:
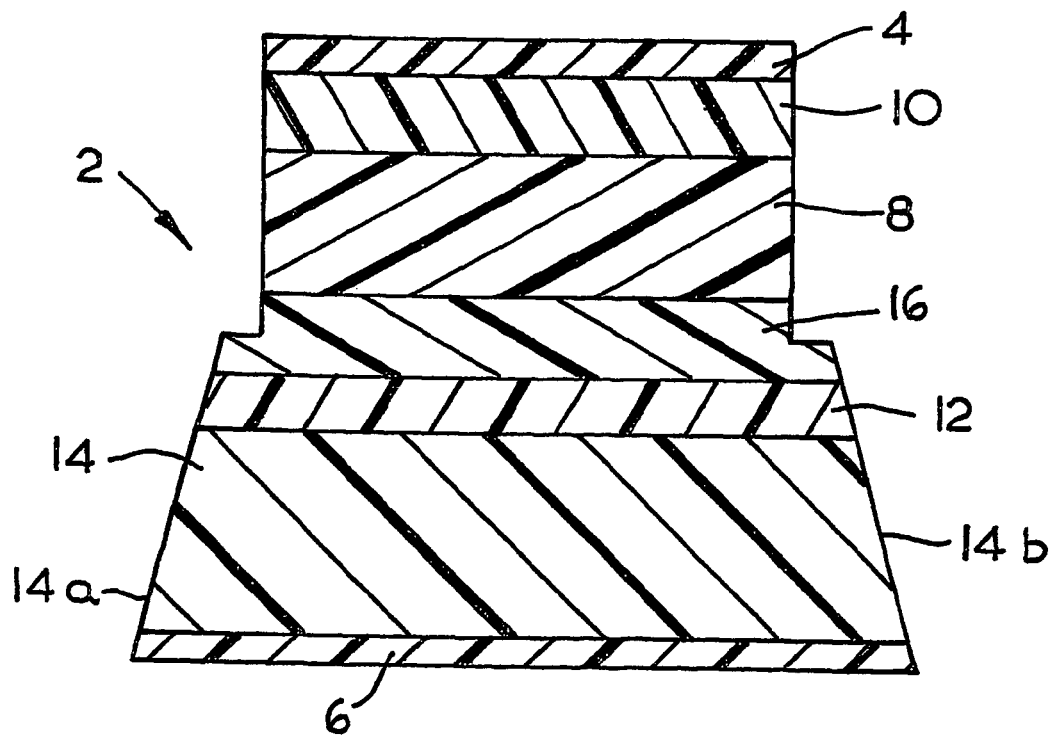
FIG. 2 shows a cross section through the horizontal plane along line AA of the photo detector of FIG. 1.

FIG. 1 shows schematically a perspective view of a photo detector comprising a photon bottle design having a cylindrical light confining portion according to the present invention. The light confining structure is supported by a semiconductor layer and for p-i-n detectors this layer would be used to fabricate the lower contact. For a SAM APD the avalanche region can be formed within this layer. FIG. 2 shows a cross section through the horizontal plane along line AA of the photo detector of FIG. 1. The lower half of FIG. 2, the semiconductor layer supporting the light confining structure has been configured as an avalanche zone for a SAM APD. The surplus parts of the supporting layer in FIGS. 1 and 2 would be etched away. FIG. 2 would then represent the vertical cross section along any line obtained by rotating AA about the centre as far as the join with the waveguide.

An example of a photon bottle SPAD (2) according to the present invention which is a separate absorption and multiplication avalanche photo diode (SAM APD) has the configuration which is shown in FIGS. 1 and 2. The SPAD (2) has a heavily doped P$^+$ contact region (4), a heavily doped N$^+$ contact region (6) both of Silicon and a multi-quantum well structure (8) of Silicon Germanium (SiGe) which is used for absorbing light. An optional spacer layer of Silicon (10) is located between the P$^+$ contact region (4) and the SiGe multi-quantum well structure (8). The layer (12) is a layer of doped Silicon which is used to switch the vertical electric field from a low value in the absorption region (8) to a high level in an avalanche zone (14). The layers of Si (10,16) above and below the SiGe layer (8) confine light within the SiGe layer (8) in the vertical direction. As can be seen from FIGS. 1 and 2, the avalanche zone (14) is bevelled in order to reduce surface fields. The layer (16) is a further Silicon spacer layer between the multi-quantum well structure (8) and the avalanche region (14). The layer (12) may be located in the upper mesa, if desired.

With the area of the absorption mesa of the SPAD (2) smaller than that of the avalanche region (14), the photo current will flow into the central region of the avalanche region (ie. away from the bevelled edges of the avalanche region) where the electric field is highest. This should reduce jitter on the avalanche current rise time. Also, the excess noise of an avalanche process is reduced in high electric fields for the initial rise of the avalanche current.

The upper mesa of the SPAD (2) comprising the upper part of spacer layer (16), multi-quantum well structure (8), spacer layer (10) and the P$^+$ contact region (4) is configured to form the photon bottle structure shown in FIG. 1, which comprises a short length of longitudinal waveguide (18) which is terminated in a cylindrical portion (20). Incident light is directed into the waveguide (18) at end surface (22). This light propagates along the waveguide (18) and is injected substantially tangentially into the cylindrical portion (20) and becomes trapped within the cylindrical portion (20) in whispering gallery type modes and so propagates repeatedly around the circumferential region of the cylindrical structure.

Whispering gallery modes (sometimes referred to as morphology-dependent resonances) are high angular momentum electromagnetic modes that correspond to photons being confined within the cylindrical portion (20) by repeated total internal reflection from the internal circumferential surface of the cylinder at grazing incidence and satisfying a phase condition after circling around the internal circumferential surface. To excite these whispering gallery modes, light has to be coupled into the cylindrical portion (20) beyond the critical angle for the interface of materials at the confining internal circumferential surface in order to achieve total internal reflection. Hence the photon bottle SPAD (2) is configured with waveguide (18) oriented substantially tangentially to the internal circumferential surface of the cylindrical portion (20).

The critical angle for a SiGe/air interface is an angle of approximately 15° and so the internal circumferential or peripheral surface of the light confining structure need not have a circular horizontal cross-section but could have a polygonal horizontal cross section. Furthermore, it is not essential that the light is injected tangentially, although it must be injected at an angle to the internal peripheral confining surface which is greater than the critical angle, so as to excite the whispering gallery modes.

Light will enter the SPAD (2) horizontally through end surface (22), will travel along the waveguide portion (18) and will then propagate around the cylindrical light confining portion (20). In this way the incident light can be confined within the volume of the SiGe layer (8) within the cylindrical portion (20) so that a photo current is generated. This photo current flows vertically and is multiplied by the avalanche zone (14) to generate a measurable current output. The light confining cylindrical structure (20) has the effect of significantly increasing the effective absorption length of the SiGe layer (8). Thus, the SiGe layer (8) can occupy a small volume. Because of the horizontal access of the light into the SPAD (2) and because the light is propagated repeatedly around the cylindrical portion (20), the layer (8) can be a vertically thin layer, of the order of a micron while still providing a long enough effective absorption length to generate a detectable photo current for low incident light levels. This makes the SPAD (2) according to the present invention fast and of high quantum efficiency as compared to known Si/SiGe based detectors which operate around 1.31 μms wavelength. Furthermore, the layer (8) has a small horizontal cross-sectional area which reduces leakage current and reduces jitter in the multiplication process.

The operation of the SPAD (2) has been simulated by analysing the optical localisation of a pulse of light propagating within the SPAD (2) using a three dimensional finite difference time domain (FDTD) simulation. The time evolution of the pulse within the dielectric then allows one to study the confinement and also provides information about the parasitic losses through the surface and from scattering at the junction of the waveguide and cylinder. Further details about this type of simulation can be found in books by A. Taflove entitled 'Computational Electrodynamics, The Finite-Difference Time-Domain Method' published by Artech House in 1995 and by Karl S. Kunz and Raymond J. Lubbers entitled 'The Finite Difference Time Domain Method for Electromagnetics' published by CRC Press in 1993. The simulation is initiated by injecting a Gaussian pulse into the neck of the waveguide (18). The time evolution of the pulse within the dielectric of the SPAD (2) is simulated using the standard FDTD technique based on the Yee algorithm (See K. S. Yee, 1996, IEEE Trans Antennas and Propagation 14, 302 for more details) and second order Mur absorbing boundaries (See G. Mur 1981 IEEE Trans Electromagnetic Compatibility 23, 1073–1077 for more details) The pulse is injected uniformly over a vertical plane within the neck of the waveguide (18) using a Gaussian envelope modulating a cosine, of the form $$E(t) \propto e^{-\alpha(t-t0)} \cos[\omega(t-t_0)], t \geq 0$$

where E(t)=electric field amplitude of the pulse at time t
α=the pulse width
$t_0$=time at peak of pulse
ω=frequency corresponding to a free space wavelength of 1.3 μm
t=time The simulation starts at time t=0 and the value of $t_0$ is set to allow the pulse amplitude to rise from a value of $10^{-6}$ at t=0 to a value of 1 at t=$t_0$. The resulting pulse is then allowed to propagate according to Maxwell's equations. The spatial structure of the SPAD (2) is modelled using a cubic mesh which leads to staircase errors in the modelling of the cylindrical structure (20) of the SPAD (2). The mesh size was chosen so that the mesh cube edges were about one tenth of the wavelength of light in the dielectric and at the modelled curved edges of the cylinder (20) this give some spurious weak radiative loss from the cylinder (20) which would not be seen in practice. Accordingly, the results of the simulation are predicted to be worse than would be expected in practice and to give a lower bound to the enhancement of the effective absorption coefficient of the SiGe layer (8) provided by the photon bottle design of the SPAD (2).

Figure 3B:
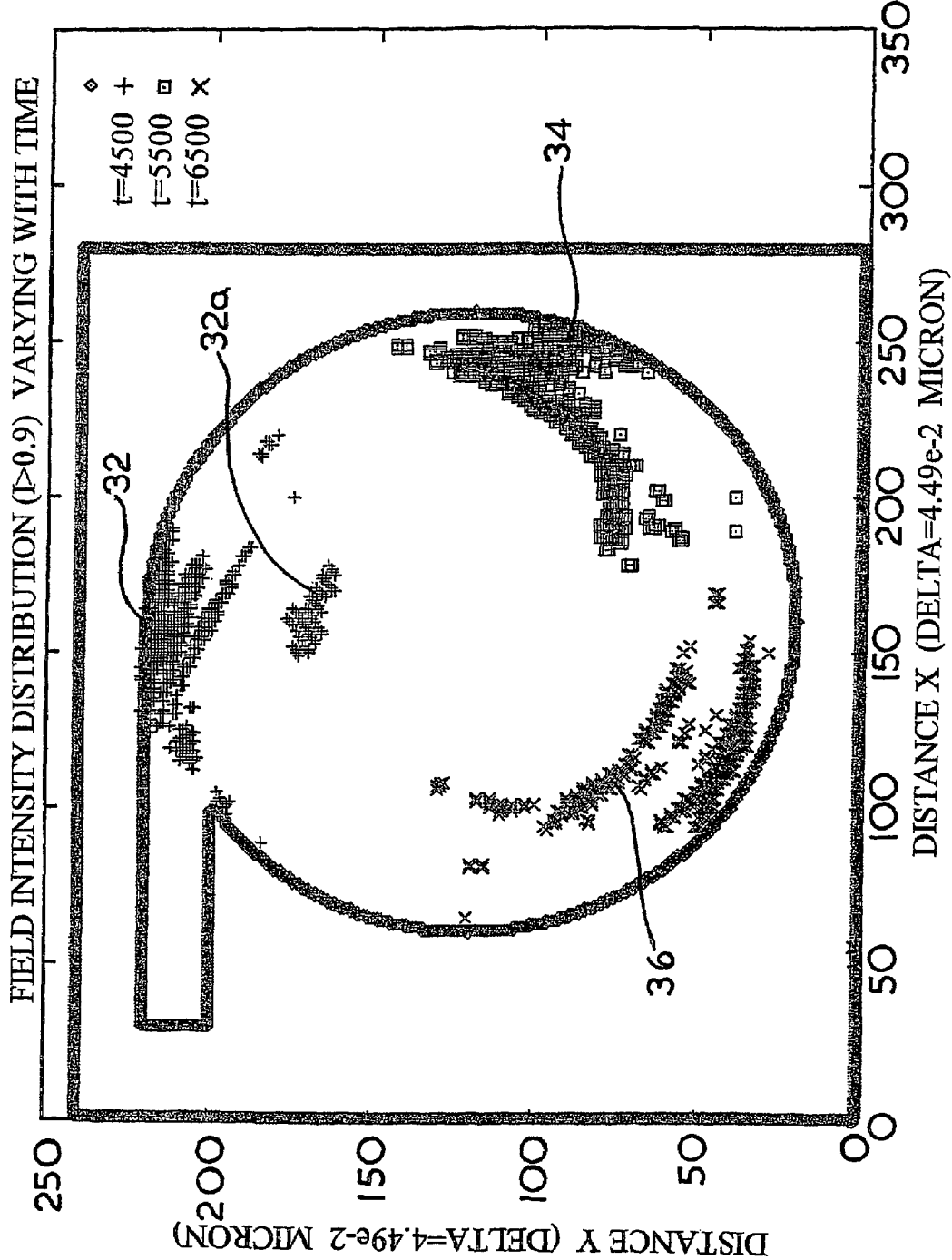
Figure 3C:
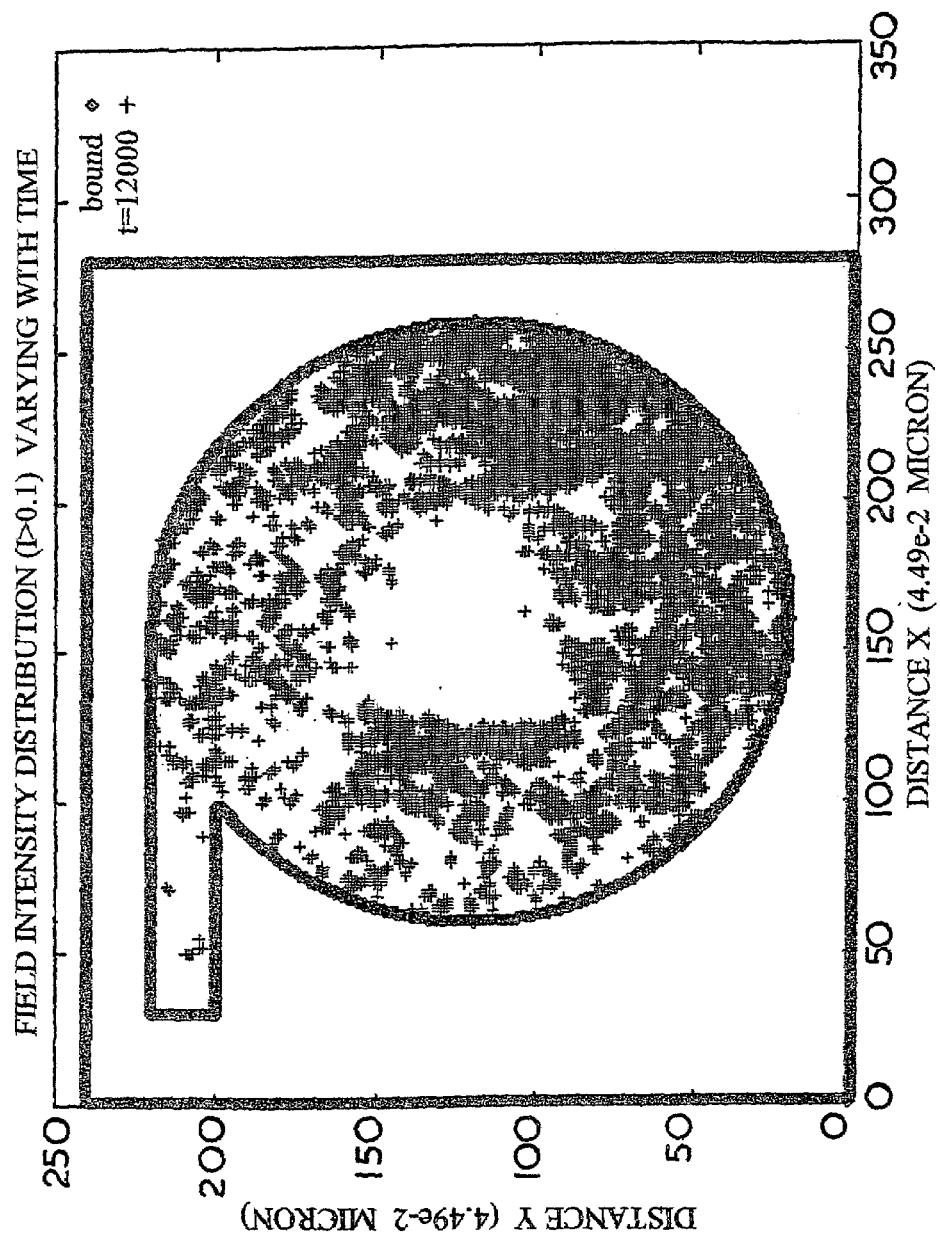

The whispering gallery modes are illustrated in the attached FIGS. 3a, 3b and 3c which are a result of the computer simulation of the light propagating through the SiGe layer (8) of the photon bottle SPAD (2) of FIGS. 1 and 2. The plots shown in FIGS. 3a to 3c show a plan view of a bottle taken on a horizontal plane midway up the cylinder. The edges of the waveguide (18) and the cylinder (20) are shown in solid lines in FIGS. 3a to 3c and the surrounding square boundary is the Mur absorbing layer (see above). Within the boundary of the SPAD (2) in FIGS. 3a and 3b mesh points from the simulation have been plotted which have field intensities greater than 0.9 of the mean field intensity and in FIG. 3c mesh points from the simulation have been plotted which have field intensities greater than 0.1 of the mean field intensity for different numbers of time steps of the simulation. In the simulation each time step Δt was $10^{-16}$ seconds.

FIG. 3a shows how an input Gaussian pulse of light propagates along the waveguide (18) and around the periphery of the cylinder (20). It shows a dispersive effect related to the expansion of the pulse into many whispering gallery type modes. In FIG. 3a, at time t=500×$10^{-16}$ s a pulse of light can be seen in the waveguide (18) just about to enter the cylinder (20) in region (24). At time t=1500×$10^{-16}$ s the pulse of light can be seen in region (26) to have propagated about one quarter of the way around the confining internal cylindrical surface of the cylinder (20). At time t=2500×$10^{-16}$ s the pulse of light can be seen in region (28) to have propagated about half way around the confining internal cylindrical surface of the cylinder (20). At time t=3500×$10^{-16}$ s the pulse of light can be seen in region (30) to have propagated over three quarters of the way around the confining internal cylindrical surface of the cylinder (20). The dispersion of the pulse into whispering gallery types modes propagating around the cylinder (20) can be observed. FIG. 3b shows the injected pulse after one circuit of the cylinder and at t=4500×$10^{-16}$ s the pulse can be seen in region (32) and scattering at the junction of the cylinder (20) and waveguide (18) can be observed as part of the pulse (32a) has broken away from the main pulse in region (32) and is seen propagating with a component normal to the internal circumferential surface of the cylinder (20). This scattering effect represents a loss mechanism for the confinement of the pulse of light. The pulse continues to propagate around the cylinder (20) with some dispersion as shown in region (34) at t=5500×$10^{-16}$ s and in region (36) at t=6500×$10^{-16}$ s. FIG. 3c shows the field intensity distribution after three circuits of the main pulse around the cylinder and plots mesh points with an intensity exceeding 0.1 of the mean at t=12,000×$10^{-16}$ s. It should be noted that near the centre of the cylinder (20) very little field intensity exists, hence the improved design of an annular light confining structure shown in the embodiment of FIGS. 4 and 5.

Figure 4:
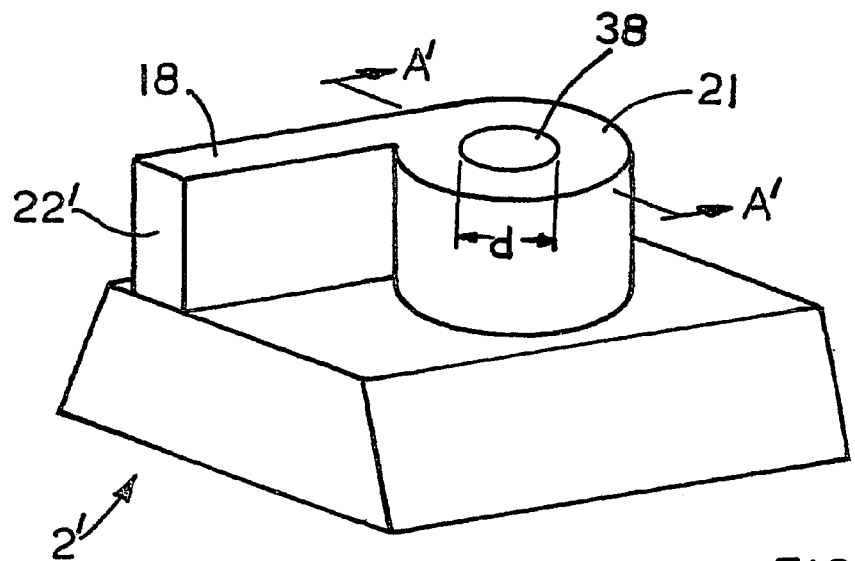
FIG. 4 shows schematically a perspective view of a photo detector comprising a photon bottle design having an annular light confining portion according to the present invention.
Figure 5:
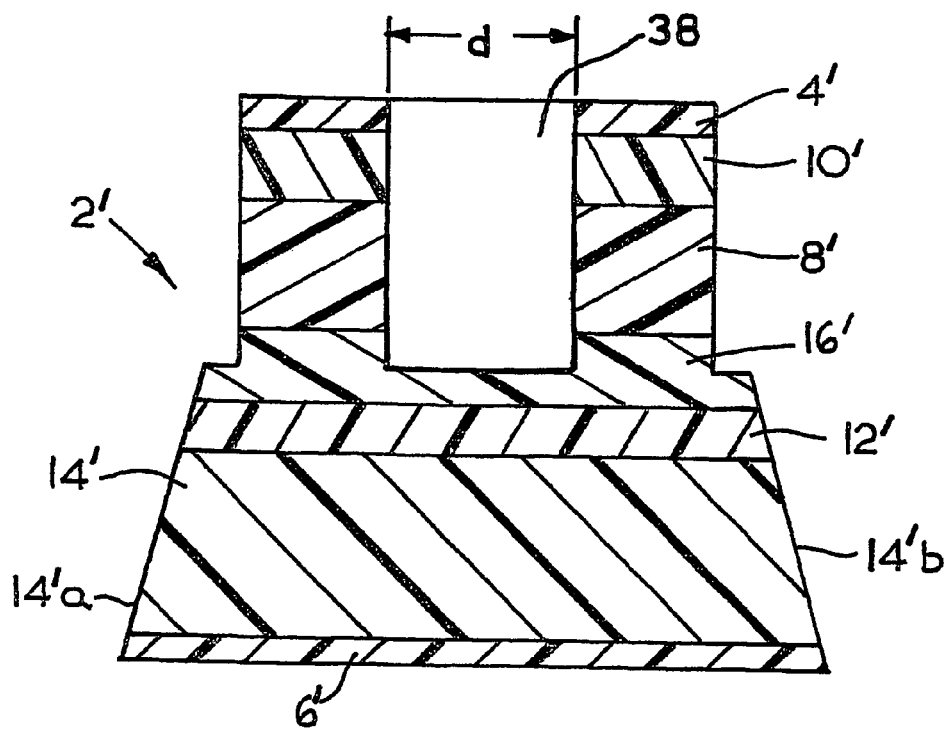
FIG. 5 shows a cross section through the horizontal plane along line AA of the photo detector of FIG. 4.

FIG. 4 shows schematically a perspective view of a photo detector comprising a photon bottle design having an annular light confining portion according to the present invention. The light confining structure is supported by a semiconductor layer and for p-i-n detectors this layer would be used to fabricate the lower contact. For a SAM APD the avalanche region can be formed within this layer. FIG. 5 shows a cross section through the horizontal plane along line AA of the photo detector of FIG. 4. The lower half of FIG. 5, the semiconductor layer supporting the light confining structure has been configured as an avalanche zone for a SAM APD. The surplus parts of the supporting layer in FIG. 4 would be etched away. FIG. 5 would then represent the vertical cross section along any line obtained by rotating AA about the centre as far as the join with the waveguide. In FIG. 5 the central cavity (38) is terminated above the avalanche region. This cavity may also extend through the avalanche region and this latter structure may be preferred with large diameter light confining structures.

The computer simulations show that the energy in the whispering gallery modes is located towards the circumference of the cylinder. As a consequence it may be better to consider annular structures in which the central region of the cylinder is etched away. By reducing horizontal cross-sectional area, these devices are likely to improve jitter and time resolution in SPAD devices and also reduce capacitance. By reducing the volume of narrow gap absorber material, the structures should also reduce volume leakage current, but at the expense of increased surface leakage current.

Figure 6:
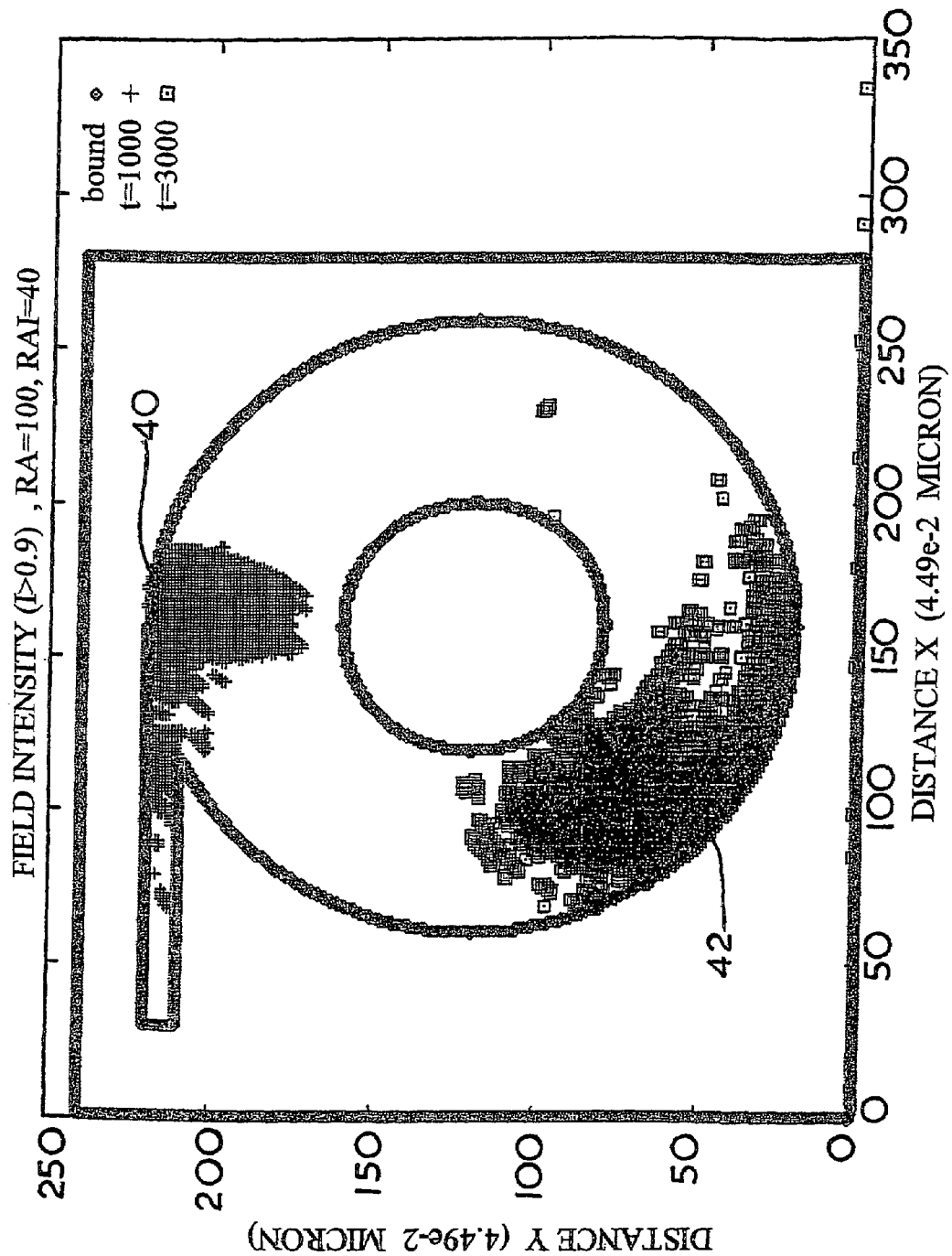
FIG. 6 show the results of a simulation of the photo detector of FIGS. 4 and 5 and comprises a plot of the field intensity distribution of an incident light pulse at varying time steps of the simulation.

FIGS. 4 and 5 show an alternative configuration of a SPAD (2') according to the present invention similar to that of FIGS. 1 and 2 with like parts numbered with like primed numeral except that the cylinder (20) is replaces by an annulus (21), ie. a central cavity (38) is formed in the cylinder (20) of FIGS. 1 and 2. For an annular structure (21) having an outer diameter D of 9 $\mu$ and an inner diameter d of 0.4D, FIG. 6 shows how an input Gaussian pulse of light propagates along the waveguide (18') and around the periphery of the annulus (21). In FIG. 6, at time t=1000×10$^{-16}$ s a pulse of light can be seen as it is injected tangentially from the waveguide (18') into the annulus (21) in region (40). At time t=3000×10$^{-16}$ s the pulse of light can be seen in region (42) to have propagated about two thirds of the way around the confining internal cylindrical surface of the annulus (21). By using an annular structure the horizontal cross-sectional area of the upper mesa of the detector is substantially reduced which will generate improved time resolutions and reduced capacitance. Also, in the annular structure the volume of the SiGe layer (8) is reduced, which will generate an associated reduction in volume leakage current associated with the layer, but at the expense of an associated increase in the surface leakage current.

Figure 7:
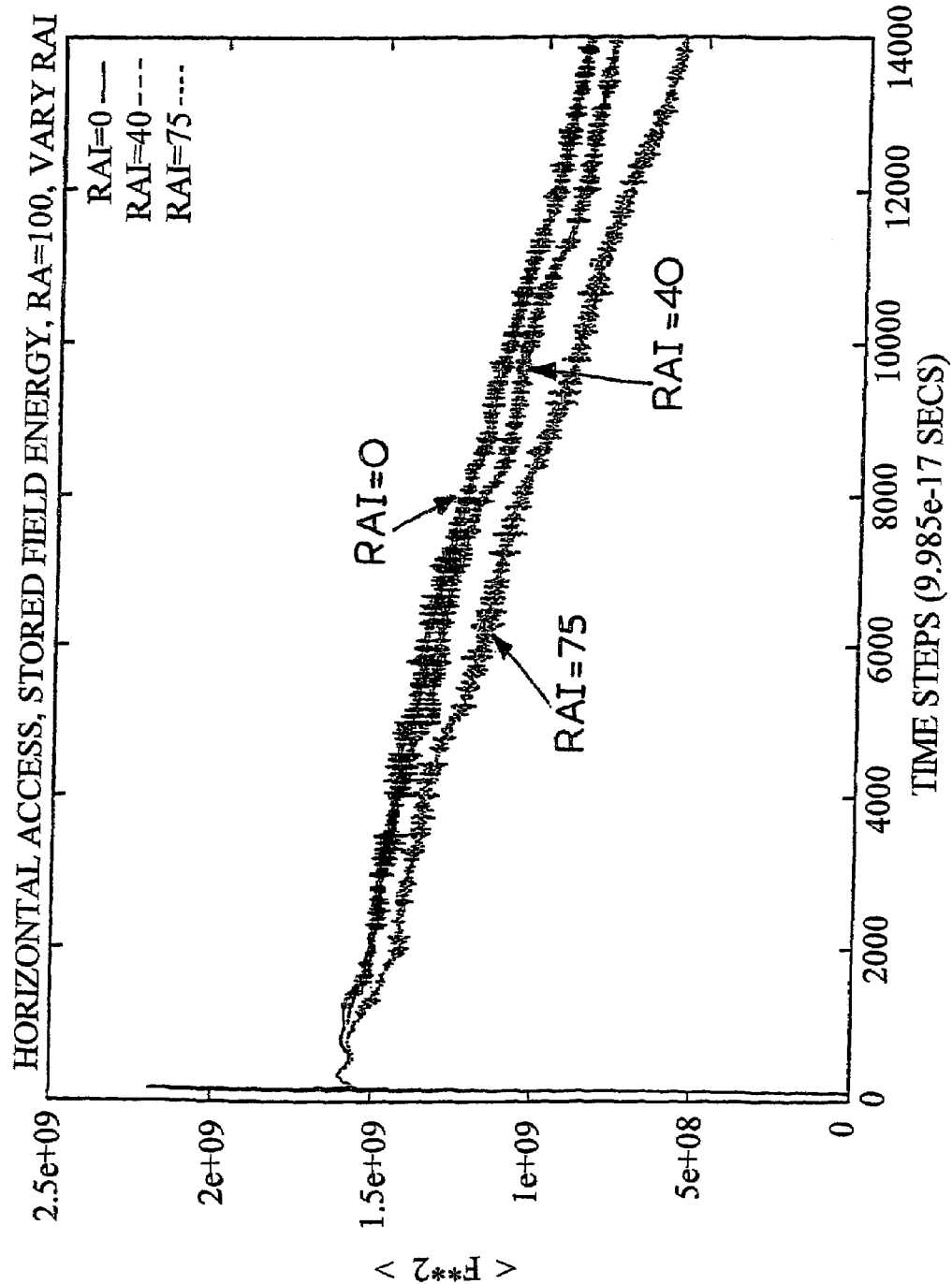
FIG. 7 shows further results of a simulation of the photo detector of FIGS. 1, 2, 4 and 5 and comprises a graph showing how the stored field energy in the detector decays with time, for different internal diameters (RAI) of an annular or cylindrical (RAI=0) light confining portion of the SPAD.

Referring back to the simulation, the average stored field energy <F$^2$> of a Gaussian pulse within the SPAD structure (2') is defined as the sum over all the mesh points within the structure of the square of the modulus of the electric field at each mesh point. This value <F$^2$> is plotted as a function of time in FIG. 7 for an annular structured SPAD device (2) with an outer diameter D of 9 $\mu$m with varied inner diameters (d in FIGS. 4 and 5 or RAI in FIG. 7) of 0 $\mu$m, 0.4D and 0.75D. The plot for d=0 $\mu$m is the plot for the SPAD structure (2) of FIGS. 1 and 2. For smaller values the of inner diameter (d,RAI) the curves of FIG. 7 are insensitive to the presence of the central cavity (38), indicating the usefulness of the annular structure (21) of FIGS. 4 and 5 for light confinement. It should be noted again that the simulation uses a cubic mesh which will cause staircase errors in the simulation of the curved inner and outer circumferential surfaces of the annulus (21). This roughness will lead to radiative losses in the simulation which would not occur in practice and thus the drop in stored energy seen in FIG. 7 for larger inner diameters (d,RAI), eg. RAI=7.5D is at least partly related to this effect because the surface area of the inner circumferential surface is increased. If the stored field energy <F$^2$> is approximated to vary exponentially with time as e$^{-t/\tau}$ where $\tau$ is a lifetime, then from FIG. 7 the decay time for the pulse within the structure of FIGS. 4 and 5 (with no absorption of the light to generate photo current) can be estimated to be $\tau$=5×10$^{-12}$ s which is equivalent to a decay length in Silicon of 0.5 mm. This is a parasitic decay related to loss through the boundaries of the confining structure which depends only on refractive index and will be much the same for Si and SiGe. However, this 0.5 mm decay length is provided by an annular structure with an outer diameter D of 9 $\mu$m which provides an indication of the enhancement of the absorption coefficient of a layer of SiGe (8) when it is configured in a photon bottle structure having a neck or waveguide portion (18,18') and a cylindrical or annular portion (20,21). It should be noted that in this simulation none of the light propagating around the SiGe layer is absorbed.

Figure 8:
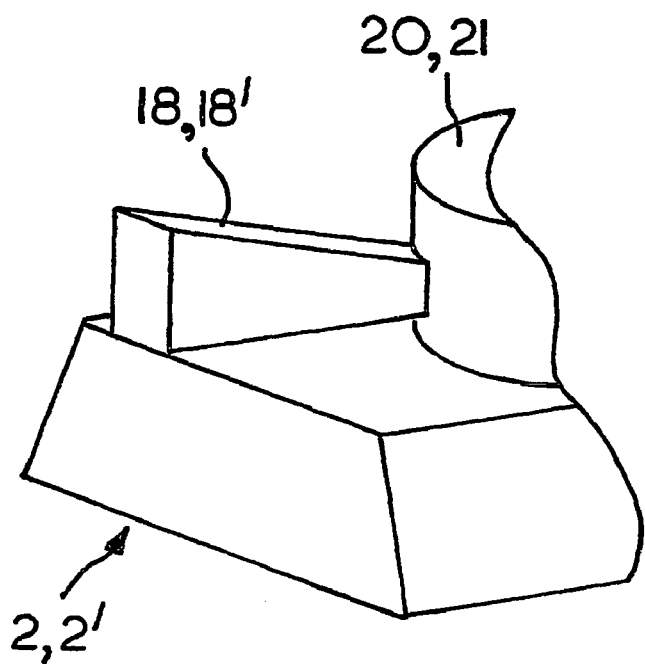
FIG. 8 shows a photo detector similar to that shown in FIGS. 1 and 4 having a tapered waveguide portion.

In order to minimise scattering at the junction between the waveguide portion (18) and the light confining portion (20,21) of the light absorbing layer (8), the waveguide portion (18, 18') may be tapered, as shown in FIG. 8, in order to make the junction with the cylindrical outer surface of the cylindrical or annular portion (20,21) as small as possible, without incurring too great a reflection loss from the tapering. When an input to the waveguide portion (18,18') is from an optical fibre, it is necessary to design the waveguide portion (18,18') to concentrate the light from the fibre down to a very small spot size, prior to tangential injection into the cylindrical or annular portion (20,21).

Figure 9:
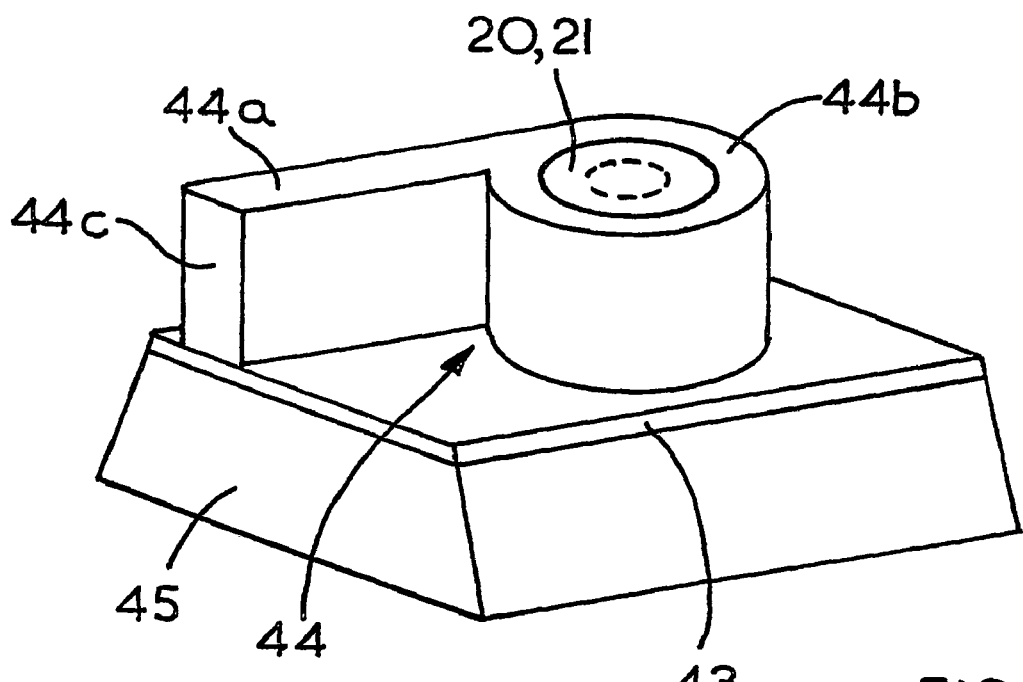
FIG. 9 shows a photo detector similar to that shown in FIGS. 1 and 4 having a polymer waveguide which transfers light into the light absorbing layer by coupling from the low refractive index polymer to the high refractive index semiconductor.

The main parasitic loss for the annular structure of Figure of FIG. 4 is due to radiation through the dielectric/air interface caused by curvature, surface roughness and scattering from the junction between the waveguide and annular structure. Another possibility is shown in FIG. 9 in which the waveguide (18) is replaced by a polymer or nitride waveguide (44) and uses step refractive index, or evanescent coupling to couple light from the polymer waveguide (44) into the cylindrical or annular structure of the light confining portion (20,21). The waveguide has a longitudinal portion (44a) into which light is coupled via end surface (44c) and an annular portion (44b) which surrounds the cylindrical or annular structure of the light confining portion (20,21). The polymer waveguide (44) is deposited on a passivating oxide layer. The oxide layer (43) needs to be thicker than about 0.4 $\mu$m to minimise coupling into the substrate (45) (See Siegert et al, 1998, IEEE Journal of Selected Topics in Quantum Electronics, 4, 970–74 for more details). The waveguide modes of light within the annular portion (44b) of the waveguide (44) will be coupled by evanescent coupling into whispering gallery modes around the periphery of the cylindrical or annular light confining portion (20,21) due to the higher refractive index of the latter. The longitudinal portion (44a) of the waveguide (44) could also be tapered to concentrate incident light.

The use of polymer waveguides will decouple the waveguide design from the design of the annular structure allowing, for example, 3D tapers.

The waveguide (44) shown in the photo detector of FIG. 9 could alternatively be made from Si$_3$N$_4$ which has a refractive index intermediate between SiO$_2$ and Si.

If the polymer or Si$_3$N$_4$ structure (44) is deposited on a horizontal layer of SiO$_2$ (43), it must have a refractive index (n) intermediate to that of SiO$_2$ (n=1.447) and Si (n=3.4). The polymer or nitride is shown in direct contact with the vertical walls of the light confining portion (20,21) so that the energy propagating in whispering gallery modes in the polymer or nitride (44b) will transfer into whispering gallery modes in the higher refractive index semiconductor (20,21) where it will be confined. Alternatively, there could be a layer of material transparent to light, eg SiO$_2$ between the cylinder (20,21) and the waveguide (44). If this interface layer has a lower refractive index than the material of the waveguide, then it must be sufficiently thin to allow the light to couple evanescently to the whispering gallery modes in the inner cylinder (20,21). This use of polymer or nitride allows independent design of the waveguide component and the semiconductor detector. It also eliminates the junction of waveguide (44) and confining structure (20,21) in the design of the semiconductor detector which is a source of parasitic loss.

Figure 10A:
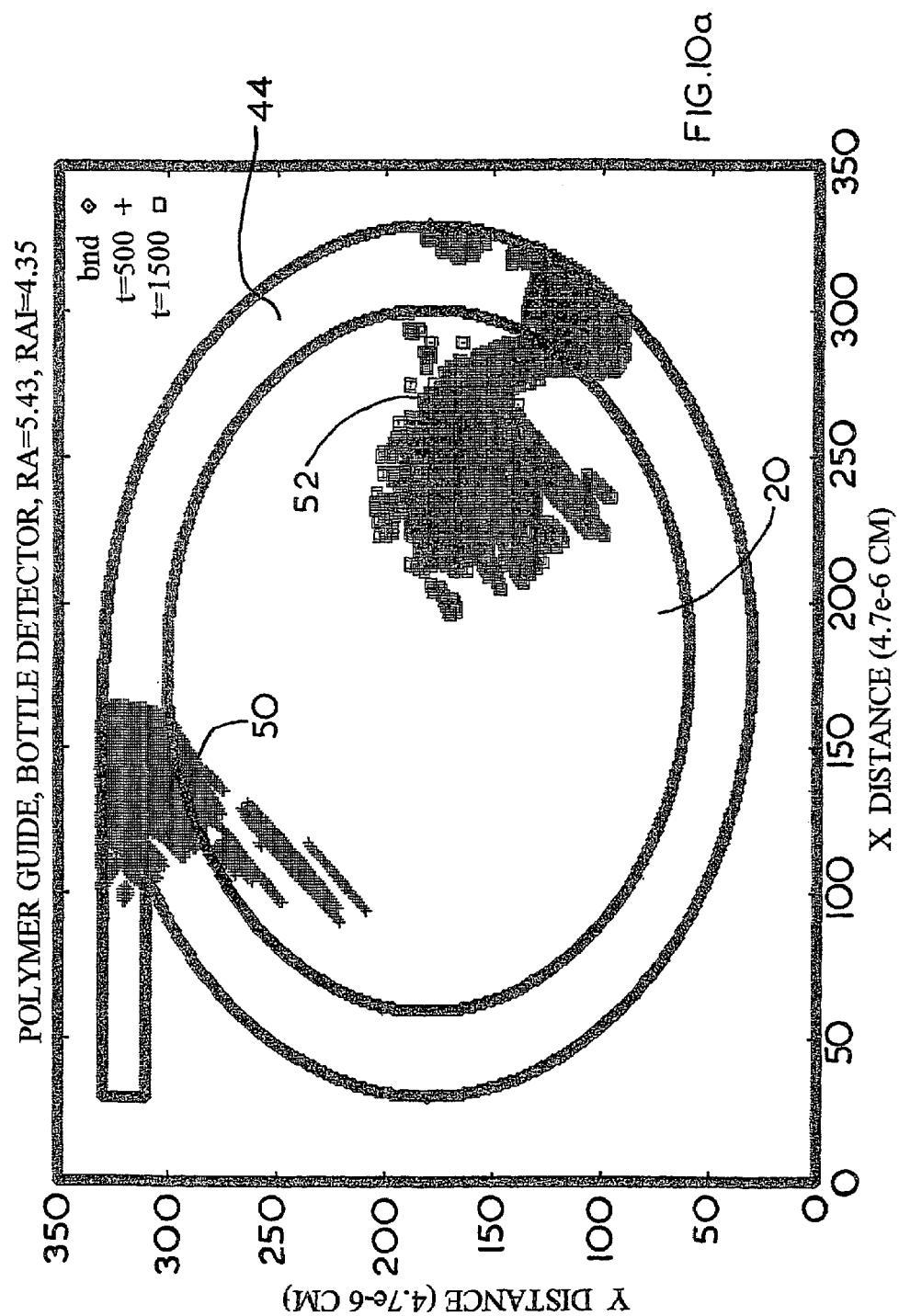
FIGS. 10a to 10d show the results of a simulation of the photo detector of FIG. 9 and comprises a plot of the field intensity distribution of an incident light pulse at varying time steps of the simulation.
Figure 10B:
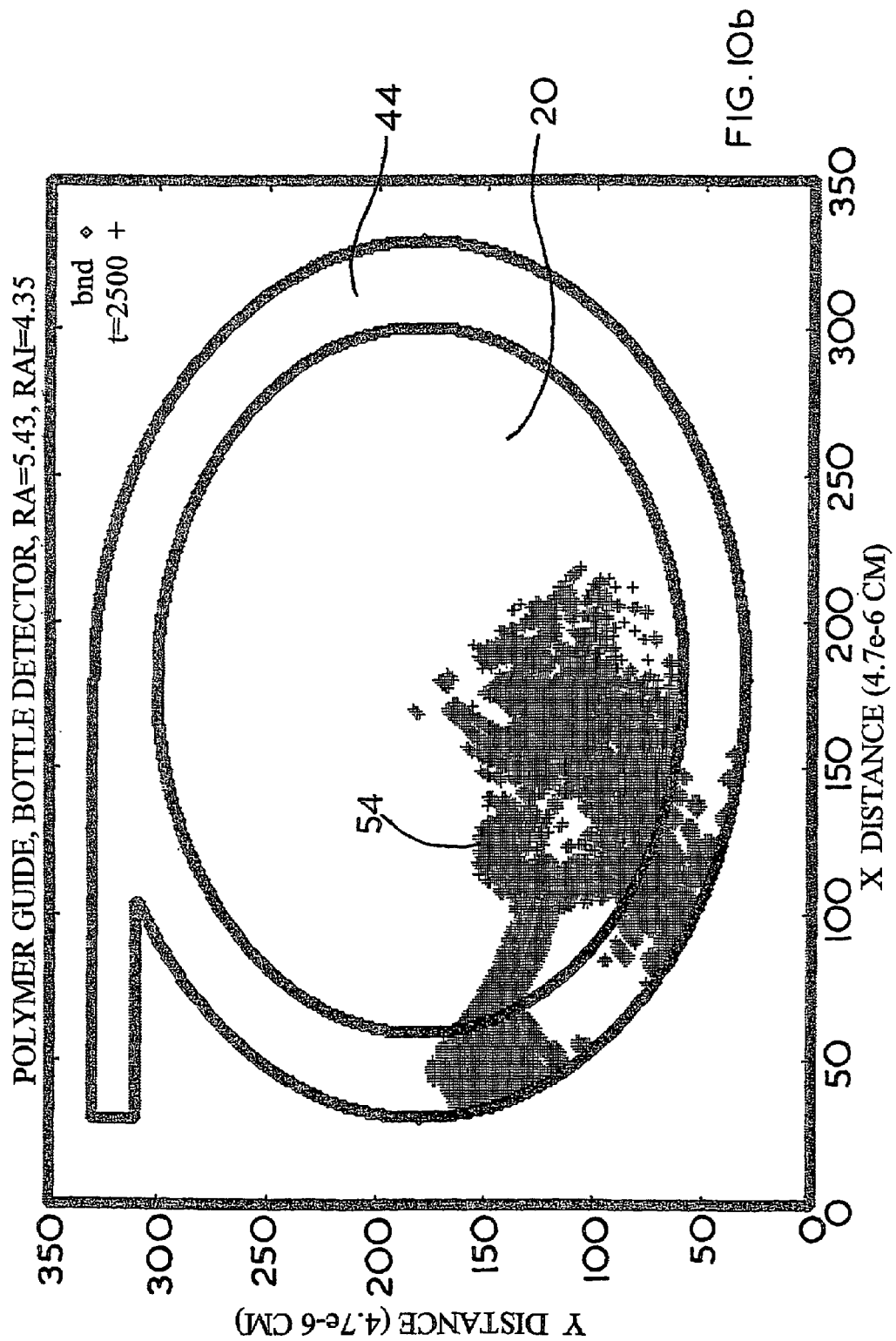
Figure 10C:
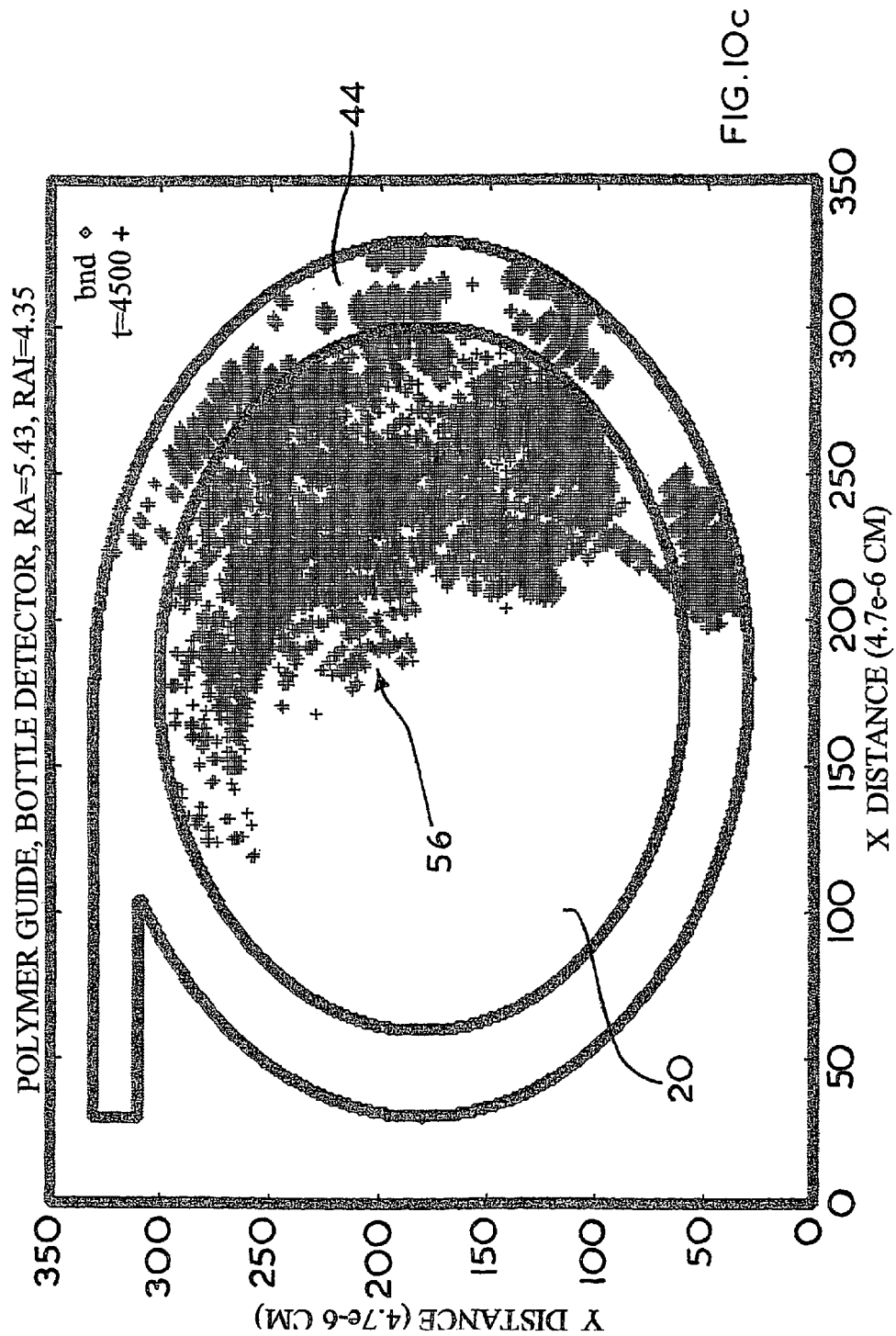
Figure 10D:
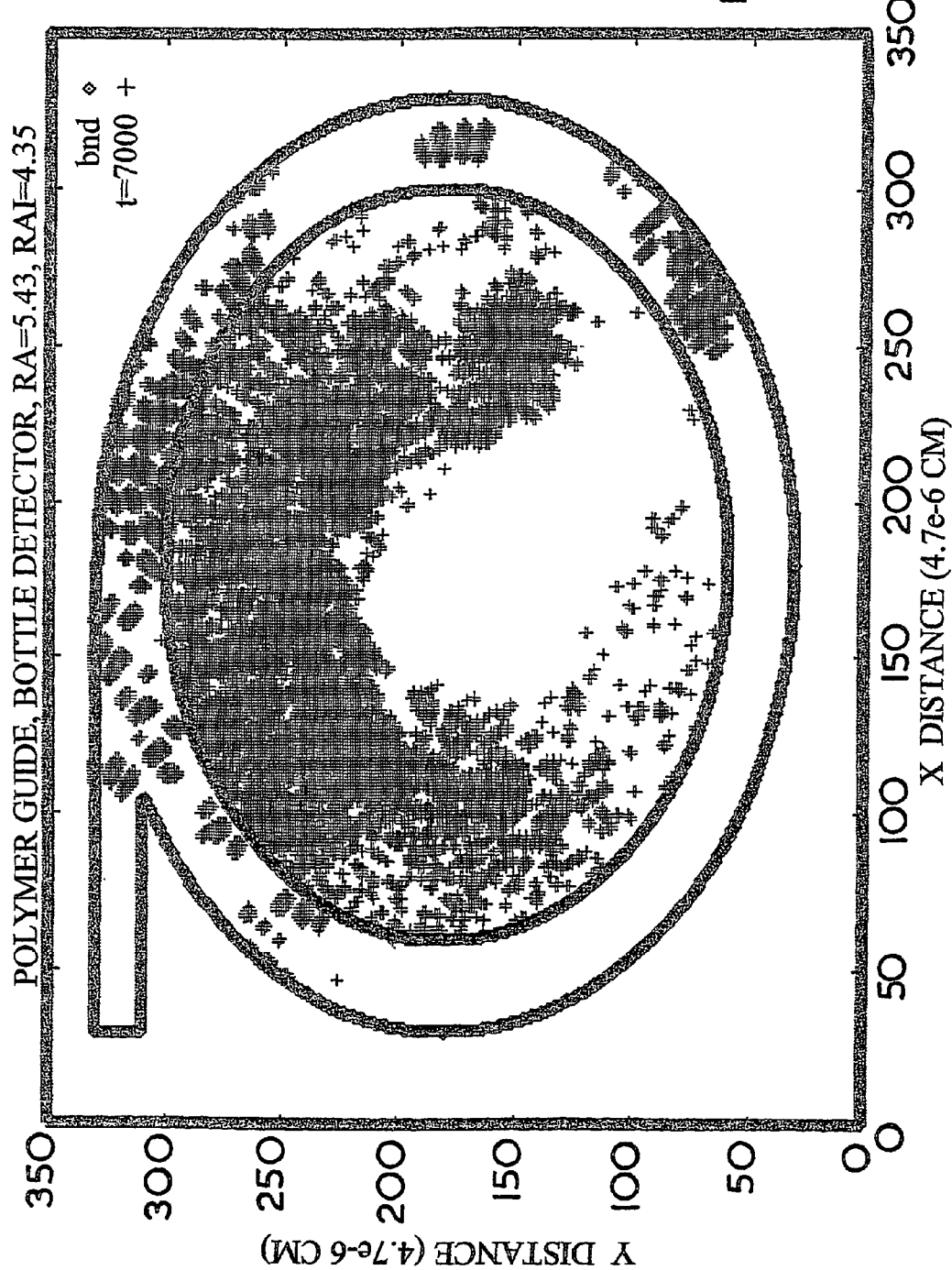
Figure 11:
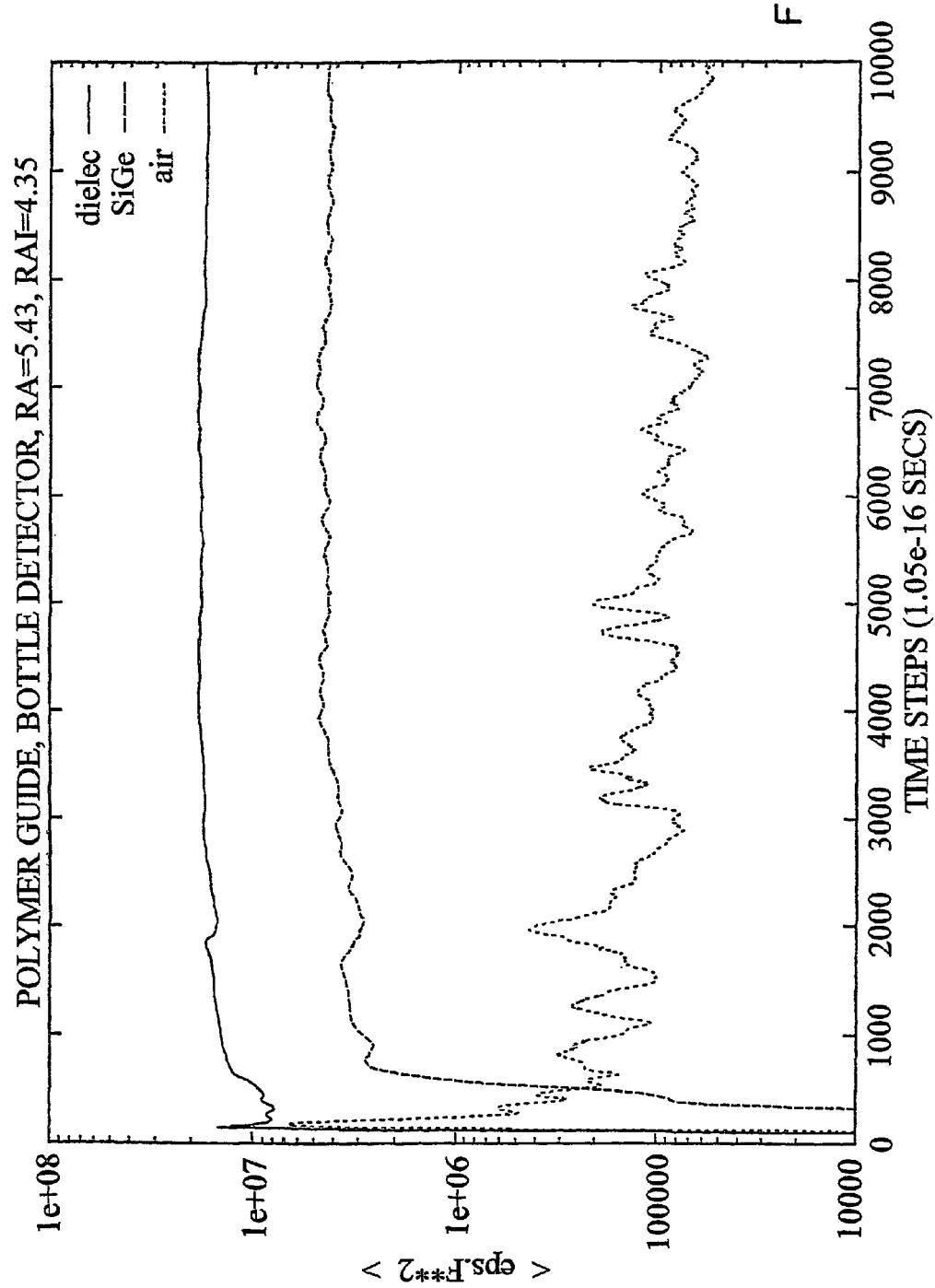
FIG. 11 shows further results of a simulation of the photo detector of FIG. 9 and shows a graph of how the stored field energy in the dielectric (comprising polymer and semiconductor), SiGe absorbing layer and surrounding atmosphere vary with time throughout the simulation.

The operation of the photo detector of FIG. 9 has been simulated as described above (except that the radii of the polymer waveguide and the cylinder are measured in units of free space wavelength instead of $\mu$ms) and results of this simulation are shown in FIGS. 10a to 10d and 11. FIG. 10a shows how an input Gaussian pulse of light propagates along the polymer waveguide (44) and how it is coupled into the cylinder (20). In FIG. 10a, at time t=500×10$^{-16}$ s a pulse of light can be seen mainly in the waveguide (44) in region (50). At time t=1500×10$^{-16}$ s the pulse of light can be seen in region (52) to have propagated about one third of the way around the confining internal cylindrical surface of waveguide (44) with a substantial amount of light coupled into the cylinder (20). In FIG. 10b at time t=2500×10$^{-16}$ s the pulse of light can be seen in region (54) to have propagated about two thirds of the way around the confining internal cylindrical surface of the waveguide (44) and the cylinder (20). In FIG. 10c at time t=4500×10$^{-16}$ s the pulse of light can be seen dispersed in region (56) after having completed one complete transit around the confining internal cylindrical surfaces of the waveguide (44) and the cylinder (20). FIG. 10d shows the injected pulse at t=7000×10$^{-16}$ s. The plots 10a to 10d show the field intensity transferring from the outer polymer (44) with low refractive index to the inner cylinder (20) of Si/SiGe with high refractive index. This indicates that the optical transfer is fast and unlikely to limit the speed of the device. The polymer is in direct contact with the cylinder and so the energy transfers to the higher refractive index material. According to the plots the confinement in the Si/SiGe layer appears to be better than in the previous configurations discussed above. FIG. 11 shows how the stored field energy in the dielectric (comprising polymer and semiconductor) (44), the SiGe absorption layer of the cylinder (20) and the air surrounding the waveguide varies with time according to the simulation. This shows the light confinement in the SiGe layer which enhances the effective absorption coefficient of the SiGe layer. The parasitic decay of stored energy in the SiGe absorber layer is too small to be discernible on this plot. This suggests that radiative losses are greatly reduced in this structure.

As shown in FIGS. 1, 2, 4, 5, 8 and 9, the upper part of the SPAD (2,2') is formed as a mesa above the avalanche regions (14,14') so that the photo current generated in the absorption layer (8,8') flows into the central region of the avalanche zone (14,14') where the electric field is strongest, ie. away from the edges (14a,14b). This will reduce jitter in the avalanche process and will be of special use where the absorption layer (8,8') has a low surface leakage current.

The photon bottle SPADs shown in FIGS. 1, 2, 4, 5, 8 and 9 could be formed using a Gallium Arsenide or Indium Phosphide based materials structure, instead of a Silicon based materials structure. The SPAD (2,2') could then be formed of a heavily doped P$^+$ contact region (4,4'), a heavily doped N$^+$ contact region (6,6'), field switching layer (12,12') and spacer layers (10,10',16,16') all of Gallium Arsenide with a multi-quantum well structure (8,8') of Gallium Arsenide Nitride which would be used for absorbing light. This detector would be suitable for absorbing light with energy slightly above the band gap of the nitride layer.

Figure 12:
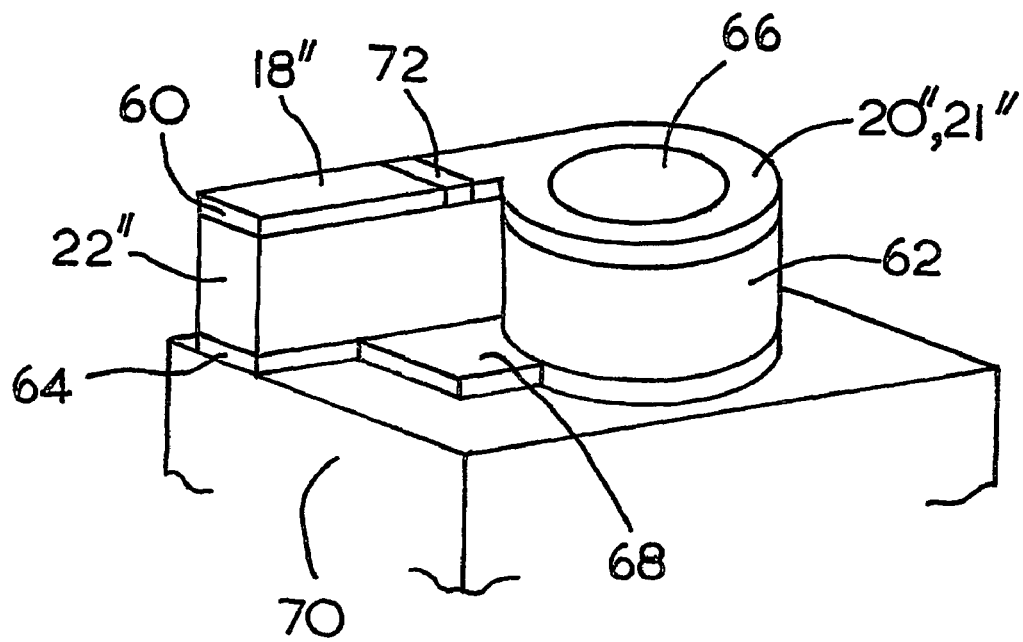
FIG. 12 shows a p-i-n detector in accordance with the present invention.

FIG. 12 shows a p-i-n detector according to the present invention with like parts identified with like numerals appended with a ". The p-i-n has a photon bottle structure similar to the upper mesa of the SPADs shown in FIGS. 1 and 4, with a waveguide portion (18") and a light confining structure (20",21"). The p-i-n detector comprises a p$^+$ doped GaAs layer (60), a InGaAsN lattice matched layer (62), an n$^+$ doped GaAs layer (64), a top metal contact (66) and a bottom metal contact (68) and is grown on a semi-insulating substrate of GaAs (70). The waveguide portion (18") is formed with an isolation notch (72) which can be formed by etching away the p$^+$ layer. The isolation notch (72) may not be required if the length of the waveguide (18") is made short in order to minimise absorption of light therein. If the top contact (66) is a Shottky contact then the level of p doping in the layer (60) would be low and again the isolation notch (72) would not be required. If the detector of FIG. 12 is operated using the Franz Keldysh effect then there would be no absorption in the waveguide (18") and the electric field would be applied to the cylindrical or annular portion (20", 21") only to induce absorption. It is also possible to include low refractive index AlGaAs cladding layers above and below the absorbing layer in this structure to improve vertical confinement.

As an alternative to the waveguide (18") a polymer or nitride waveguide could be used to couple light into the light confining portion (20",21") in a similar way as is discussed above in relation to the SPAD of FIG. 9.

Using the present invention, a GaAs p-i-n detector with Aluminium Gallium Arsenide (AlGaAs) cladding can be operated at wavelengths longer than normally feasible. In this way the p-i-n could be combined with a GaAs avalanche zone in much the same way as described above for SiGe/Si. There is also much interest in Nitrogen (N) doped GaAs, in which 4% N gives a strained material with a bandgap of 1 eV as compared to the GaAs bandgap of 1.4 eV. The strained layers of GaAsN are interleaved with layers of GaAs in a similar way to SiGe/Si and light confining structures can be fabricated in accordance with the present invention. Similarly, N doped InGaAs layers can be lattice matched to GaAs and by varying the percent of In and N it is expected that the detector responses can be extended to 1.3 $\mu$ and 1.5 $\mu$. Furthermore, there is a continuous development of new material systems and structure where the light confining structures according to the present invention could be usefully applied. The use of the Franz Keldysh effect (shift of the absorption edge in high electric field) combined with the increase effective absorption from the light confining structures according to the present invention is one example. In the case of the present invention the electric field would be applied to the cylindrical detection part of the structures discussed below.

The Si/Ge structures above can be manufactured using standard Si growth technology, consisting of initial epitaxial growth of the semiconductor layers followed by processing, which processing would consist of sequences of lithography and etching. Similarly the GaAs based structures described above can be manufactured using standard GaAs growth technology.

Figure 13:
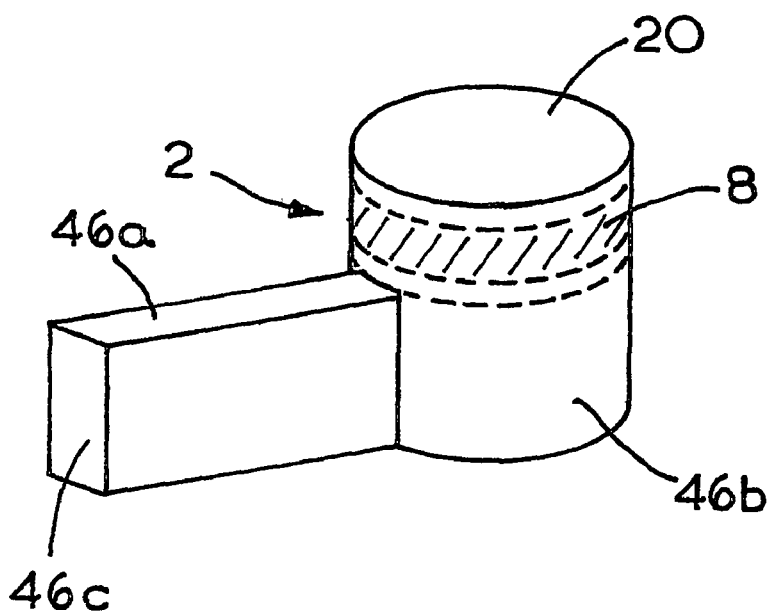
FIG. 13 shows an alternative to the photo detector of FIG. 1 in which the lower part of the structure incorporating a waveguide and cylinder do not absorb light.

An additional alternative embodiment to that which is shown in FIGS. 1 and 2 is shown in FIG. 13, with like parts identified by like numerals. In the embodiment of FIGS. 1 and 2, the waveguide (18) and the cylinder (20) both contain absorbing material and the absorption in the waveguide is an unwanted loss mechanism. This loss mechanism is removed in the embodiment of FIG. 13 because the waveguide (46a) and the lower part of the cylinder (46b) do not absorb light. Above the lower part of the cylinder (46b) is an upper cylinder part consisting of light absorbing material (8) of a relaively high refractive index. The upper cylinder part could, for example, be grown by epitaxy.

Light injected into the end (46c) of the waveguide portion (46a) becomes trapped in whispering gallery modes in the lower cylinder part (46b) and rapidly transfers to whispering gallery modes in the higher refractive index material of the upper cylinder part where it is absorbed in the light absorbing layer (8).

What is claimed is:

1. A horizontal access semiconductor photo detector comprising a horizontal light absorbing layer for converting light into photo-current which layer is configured to confine light within it in whispering gallery modes of propagation.

2. A detector according to claim 1 wherein the detector is configured to have a waveguide portion and a light confining portion arranged such that the waveguide portion couples light into the detector and transfers light into the light confining portion so as to excite whispering gallery modes of propagation around the light confining portion.

3. A detector according to claim 2 wherein the waveguide portion transfers light into the light confining portion at an angle to a boundary of the light confining portion greater than the critical angle of the boundary.

4. A detector according to claim 2 wherein the light confining portion has a cylindrical outer boundary.

5. A detector according to claim 4 wherein the waveguide portion injects light substantially tangentially into the light confining portion with respect to the cylindrical outer boundary.

6. A detector according to claim 1 comprising a longitudinal waveguide portion and a cylindrical light confining portion.

7. A detector according to claim 1 comprising a longitudinal waveguide portion and annular light confining portion.

8. A detector according to claim 2 wherein the waveguide portion is tapered in order to reduce the size of the interface between the waveguide portion and the light confining portion.

9. A detector according to claim 1 wherein the horizontal light absorbing layer is a layer in the second light confining portion.

10. A detector according to claim 1 wherein a waveguide made of a material having a refractive index which is less than the refractive index of the light absorbing layer is used to couple light into the light absorbing layer by evanescent coupling and excite whispering gallery modes of propagation therein.

11. A detector according to claim 1 wherein the horizontal light absorbing layer is located vertically above or below the light confining portion and has a higher refractive index than the light confining portion and light is coupled vertically into the horizontal light absorbing layer from the light confining portion by evanescent coupling.

12. A detector according to claim 2 wherein the waveguide portion and the light confining portion are made of a material having a refractive index which is less than the refractive index of the light absorbing layer and the light confining portion extends around the periphery of the light absorbing layer to excite whispering gallery modes in the light absorbing layer by evanescent coupling.

13. A detector according to claim 10 wherein the waveguide portion and the light confining portion are made from polymer.

14. A detector according to claims 10 wherein the waveguide portion and the light confining portion are made from nitride.

15. A separate absorption and multiplication avalanche detector according to claim 1.

16. A p-i-n photo detector according to claim 1.

17. A Silicon based detector according to claim 1 comprising a Silicon Germanium light absorbing layer.

18. An avalanche detector according to claim 1 having an avalanche region wherein the light absorbing layer is formed as a mesa above a central part of the avalanche region.

19. An avalanche detector according to claim 2 wherein the horizontal width of the waveguide portion is less than the horizontal width of the light confining portion.

20. An avalanche detector according to claim 19 wherein the horizontal width of the waveguide portion is less than $1/8$ of the horizontal width of the light confining portion.

21. A horizontal access semiconductor photo detector comprising a horizontal light absorbing layer for converting light into photo-current which layer is configured to confine light within it in whispering gallery modes of propagation, wherein the detector is configured to have a waveguide portion and a light confining portion arranged such that the waveguide portion couples light into the detector and transfers light into the light confining portion so as to excite whispering gallery modes of propagation around the light confining portion, wherein the horizontal width of the waveguide portion is less than $1/8$ of the horizontal width of the light confining portion.

* * * * *